United States Patent [19]

Savignac et al.

[11] Patent Number: 5,657,279

[45] Date of Patent: Aug. 12, 1997

[54] REDUNDANT CIRCUIT CONFIGURATION FOR AN INTEGRATED SEMICONDUCTOR MEMORY

[75] Inventors: Dominique Savignac, Ismaning; Diether Sommer; Oliver Kiehl, both of München, all of Germany

[73] Assignee: Siemens Aktiengesellschaft, Munich, Germany

[21] Appl. No.: 514,602

[22] Filed: Aug. 14, 1995

[30] Foreign Application Priority Data

Aug. 12, 1994 [EP] European Pat. Off. ............ 94112661

[51] Int. Cl.$^6$ ................................................ G11C 8/00
[52] U.S. Cl. ........................... 365/200; 365/230.06
[58] Field of Search .................... 370/10.3; 365/200, 365/230.06

[56] References Cited

U.S. PATENT DOCUMENTS

| 5,293,339 | 3/1994 | Suzuki et al. | 365/200 |
| 5,293,564 | 3/1994 | Sukegawa et al. | 365/200 |

FOREIGN PATENT DOCUMENTS

| 0492099 | 7/1990 | European Pat. Off. |
| 0472209 | 2/1992 | European Pat. Off. |

OTHER PUBLICATIONS

IEEE Journal of Solid–State Circuits, vol. 26, No. 1, Jan. 1991, pp. 12–17, (Horiguchi et al.) "A Flexible Redundancy Technique for High–Density DRAM's".

Primary Examiner—David C. Nelms
Assistant Examiner—Michael T. Tran
Attorney, Agent, or Firm—Herbert L. Lerner; Laurence A. Greenberg

[57] ABSTRACT

A redundant circuit configuration for an integrated semiconductor memory has normal and redundant memory cells, in which addresses of arbitrary groups of memory cells of the memory are formed from a first partial address and a second partial address. M fixedly programmable address circuits, where $M \geq 1$, are each assigned to one of the first partial addresses. Each fixedly programmable address circuit in an activated state has the second partial address of a group of normal memory cells to be replaced and has a first output at which an activation signal is applied in the activated state of the address circuit if the first partial address applied to the circuit configuration matches the first partial address assigned to the address circuit. One address comparator is common to all of the address circuits and has a first output. The comparator compares the second partial address stored in memory in one of the address circuits with the applied second partial address, at the applied activation signal of the one address circuit. The comparator supplies an enable signal at the first output of the address comparator if the two partial addresses match. Redundance decoders are triggered by the enable signal.

10 Claims, 13 Drawing Sheets

FIG.7B-1 RKx
FIG.7B-2 RST
FIG.7B-3 K₃
FIG.7B-4 RSP

FIG.8B-1 RK'₁
FIG.8B-2 ATDN
FIG.8B-3 K'₃
FIG.8B-4 RN₀
FIG.8B-5 FR
FIG.8B-6 CSR₀
FIG.8B-7 CFR

FIG.8A-15  FR

FIG.8A-16  CSR₀

FIG.8A-17  CFR

REDUNDANT CIRCUIT CONFIGURATION FOR AN INTEGRATED SEMICONDUCTOR MEMORY

BACKGROUND OF THE INVENTION

Field of the Invention

The invention relates to a redundant circuit configuration for an integrated semiconductor memory as is disclosed, for instance, in the IEEE Journal of Solid-State Circuits, Vol. 26, No. 1, January 1991, page 12 ff., or in European Patent Application 0 472 209 A2, especially for the repair of word lines or bit lines in dynamic memories (DRAMs).

As raster dimensions become smaller with each new generation of memories, the vulnerability to defects in the cell field rises. Profitable production therefore requires devices on the memory with which such defects can be repaired. As a rule, redundant cells are provided, which are inserted in place of defective cells through the use of programmable coding elements.

In large-capacity memories, the memory cells are subdivided into a plurality of blocks. Due to the matrix-like configuration of memory cells, the redundant cells must likewise be disposed in rows and columns. Those redundant lines are generally constructed at the edge of the cell fields. They are each selected through the use of a programmable address circuit in conjunction with the addresses being applied.

By way of example, such programmable address circuits can be laser-separable fuse blocks. Typically, one or more lines is permanently assigned to each fuse block. In general, as many fuse blocks and address comparators will be used as there are independent memory blocks.

A typical prior art circuit for coding a column address in the case of column redundance is described below with regard to FIG. 1. The disadvantages thereof are that transverse currents may occur twice in each memory block group and there is an overly high number of lines and an attendant unfavorably large output gate. The disadvantages of the redundant address decoder are that it requires a large amount of space and can therefore result in a reduction in the number of chips per wafer, and the required surface area for fuse blocks together with trigger circuits is approximately twice as large as an area occupied by the redundant memory cells. Additionally, such a circuit leads to high current consumption, especially with column redundance, where the triggering of the column redundance is operationally ready over the entire active cycle. It also places a severe strain on output lines.

In European Patent Application 0 492 099 A2, a redundant circuit configuration is described where the internal block addresses of the columns or rows to be replaced are programmed in fuse blocks and only as many separable connections as in the bit width are needed. The addresses are written by a local bus to the associated redundant decoders in the on-state phase of the memory. In the redundant decoders, the addresses of the columns or rows to be replaced are stored in memory by flip-flop circuits. The comparison between the applied address and the addresses of the columns and rows to be replaced is carried out separately in each redundant decoder. Accordingly, while a savings is attained in terms of the number of separable connections, the current consumption remains high.

SUMMARY OF THE INVENTION

It is accordingly an object of the invention to provide a redundant circuit configuration for an integrated semiconductor memory, which overcomes the hereinafore-mentioned disadvantages of the heretofore-known devices of this general type and which provides an implementation of column or row redundance that requires minimal surface area in the redundant address circuits, has reduced current consumption, and puts reduced strain on the address lines.

With the foregoing and other objects in view there is provided, in accordance with the invention, in a redundant circuit configuration for an integrated semiconductor memory with normal and redundant memory cells, in which addresses of arbitrary groups of memory cells of the memory are formed from a firs partial address and a second partial address, the improvement comprising M fixedly programmable address circuits, where $M \geq 1$, each fixedly programmable address circuit being assigned to one of the first partial addresses, and each fixedly programmable address circuit in an activated state having the second partial address of a group of normal memory cells to be replaced and having a first output at which an activation signal is applied in the activated state of the address circuit if the first partial address applied to the circuit configuration matches the first partial address assigned to the address circuit; and one address comparator being common to all of the address circuits and having a first output, the comparator comparing the second partial address stored in memory in one of the address circuits with the applied second partial address, at the applied activation signal of the one address circuit, the comparator supplying an enable signal at the first output of the address comparator if the two partial addresses match, and redundance decoders being triggered by the enable signal.

Other features which are considered as characteristic for the invention are set forth in the appended claims.

Although the invention is illustrated and described herein as embodied in a redundant circuit configuration for an integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 5A, 5B, 5C1–5C4 and FIGS. 5D–5F are schematic circuit diagrams and timing diagrams of two respective embodiments of an address comparator in the case of row redundance in accordance with the present invention;

FIGS 7A1–7A14 and 7B1–7B4 are timing diagrams of signals of the circuits of FIGS. 2, 4 and 5; and FIGS. 8A1–8A17 and 8B1–8B7 are timing diagrams of signals of the circuits of FIGS. 3, 4 and 6.

DESCRIPTION OF THE PREFERRED EMBODIMENTS

Figure 1:
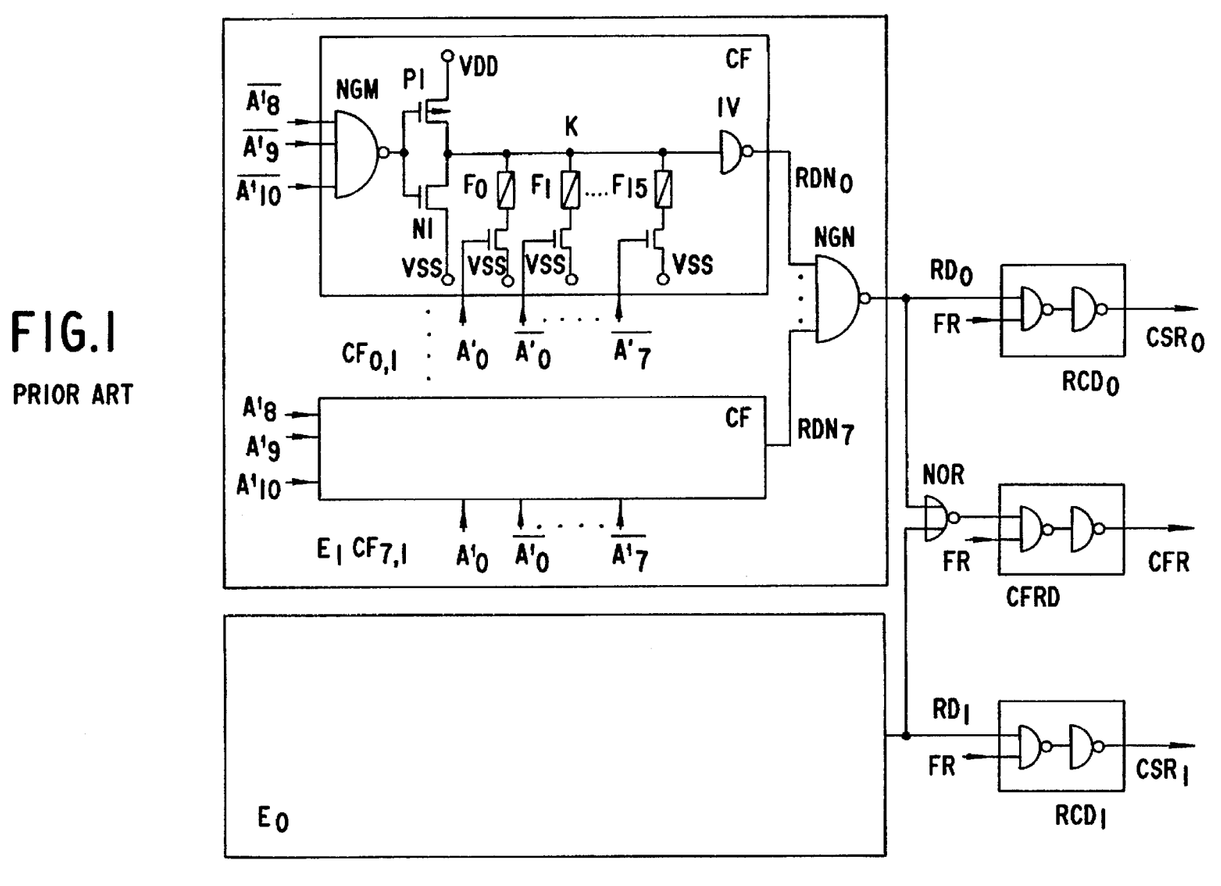
FIG. 1 is a schematic and block diagram of a prior art circuit configuration for address circuits and its triggering in the case of column redundance.

Referring now to the figures of the drawing in detail and first, particularly, to FIG. 1 thereof, there is seen a typical circuit according to the prior art for coding a column address in the case of column redundance. As an example, the memory cells in such a case are divided up into eight memory blocks, which can be called up through the use of block addresses $A'_8$, $A'_9$, $A'_{10}$. An internal block address $A'_0 \ldots _7$, that is the address of one column within one memory block, is eight bits wide in that case. Laser-separable fuse blocks are used in that case as coding elements in address circuits CF. Twice as many separable connecting elements $F_0 \ldots F_{15}$ as there are bits in the width of the internal block address are needed per fuse block.

In the example of FIG. 1, two redundant columns per memory block are provided and are coded by two groups $E_0$, $E_1$ of address circuits. Only one unit $E_1$ is shown in detail. Such a unit includes eight identical address circuits $CF_{0,0} \ldots CF_{7,0}$ for $E_0$ and $CF_{0,1} \ldots CF_{7,1}$ for $E_1$, and a NAND gate NGN with eight inputs $RDN_{0 \ldots 7}$ and one output line $RD_0$ for $E_0$ and $RD_1$ for $E_1$. In each unit $E_0$, $E_1$, each address circuit $CF_{0,0 \ldots 7,0}$ is assigned to one of the eight memory blocks. Two output signals on the output lines $RD_0$ and $RD_1$ are each delivered to a respective redundant driver $RCD_0$ and $RCD_1$ having respective outputs $CSR_0$ and $CSR_1$ and to a NOR gate NOR. An output of the gate NOR is connected to a driver CFRD, having an output signal which is indicated by reference symbol CFR. The signal CFR is delivered to a normal column decoder and locks the column decoder of the normal memory cells if a redundant driver ($RCD_0$ or $RCD_1$) is activated. The three drivers $RCD_0$, $RCD_1$ and CFRD are connected to an enable signal FR, which in a state of logical "0" keeps both the normal and the redundant selection lines at low potential logical "0". The enable signal FR is typically used for synchronization purposes on the chip.

The memory is organized in $2^3 = 8$ memory blocks, each with $2^8 = 256$ columns of memory cells per memory block. Each circuit $CF_{ij}$ therefore has three inputs for block coding and one output $RTN_i$, which is connected to one input of the NAND gate NGN.

Such a circuit $CF_{ij}$ includes a NAND gate NGM with eight inputs, followed by an inverter P1, N1, 2·8 n-channel transistors each being connected in series with one fuse element which is connected parallel to an output K of the inverter P1, N1, and an output inverter IV. Block selection is carried out through the input NAND gate NGN to which, for example, one of all of the possible combinations of three lines including the three block address lines $A'_{8,9,10}$ and their complementary lines $\overline{A}_{8,9,10}$ is supplied. A circuit $CF_{ij}$ is activated whenever all of the inputs of this NAND gate are at logical "1". The output of the NAND gate is then logical "0", and the output K of the inverter P1, N1 is consequently logical "1". In all of the other circuits CF, at least one input $A'_m$ or $\overline{A}'_m$ is logical "0". The inverter outputs K are accordingly also logical "0", and the lines $RDN_n$ are logical "1".

If $Y' = 2^{N'}$ selection lines are present, then $2·N'$ column address lines are needed for coding one column address, without any general limitation, such as $A'_{0 \ldots N'-1}$ or $\overline{A}''_{0 \ldots N'-1}$, because the series circuit of an n-channel transistor and a laser-separable fuse element exhibit an effect only at an input signal of logical "1".

If, in the activated circuit $CF_{ij}$ at least one fuse element, in which the corresponding column address lines are in the logical "1" state is not separated, then the output or output node K is kept at such a low potential, through this on-state n-channel transistor, that the output inverter IV switches to logical "1". In that case, all of the lines $RDN_{0 \ldots 7}$ accordingly have the state logical "1", and the output line RDJ of NGN has the state logical "0". The associated redundant selection line $CSR_j$ is accordingly inactive independently of the signal FR, or in other words is at logical "0". If that is true for both lines $RD_0$ and $RD_1$, then the output of the gate NOR is logical "1". If the enable signal FR becomes active, the signal CFR likewise assumes the state of logical "1", and unlocks the normal column decoder. In that case a normal bit line group is selected.

In contrast thereto, in an active circuit $CF_{i,0}$ or $CF_{i,1}$, if all of the fuse elements are opened in which the corresponding column address lines are logical "1" the node K remains charged to high potential, and the output inverter IV remains in the logical "0" state. Accordingly, a line $RD_1$ or $RD_2$ assumes the state of logical "1". The output of the gate NOR is accordingly logical "0". That is equally true for the signal CFR, regardless of the enable signal FR, so that the normal column decoder is locked. Conversely, the redundant selection line $CSR_0$ or $CSR_1$ is activated, and the corresponding redundant bit line group in an active memory clock $BK_i$ is selected.

One disadvantage of the version described above is that when a non-programmed column address is applied, that is in $Y'-1$ cases of $Y'$, over the entire active cycle, a transverse current flows through the transistor P1 of the selected circuit $CF_{i,j}$ toward the lower potential. That transverse current may possibly occur twice in each memory block group $E_1$, $E_2$, and in actual embodiments having a plurality of such groups, it assumes such an excessively high value. Another disadvantage, again in actual cases, is the overly great number of lines $RDN_{1 \ldots n}$ and an attendant unfavorably large output gate NGN.

Moreover, twice as many separable connecting elements are used per address circuit than the number of bits in the width of the internal block address. The embodiment of the redundant address decoder has two disadvantages: first, it requires a large amount of space and can therefore mean a reduction in the number of chips per wafer. In the memory generations of that kind, the required surface area for the fuse blocks together with the trigger circuits is approximately twice as large as the area occupied by the redundant memory cells.

Second, such a circuit leads to high current consumption, especially with column redundance, where the triggering of the column redundance is operationally ready over the entire active cycle. That also puts a severe strain on the output lines.

Figure 2:
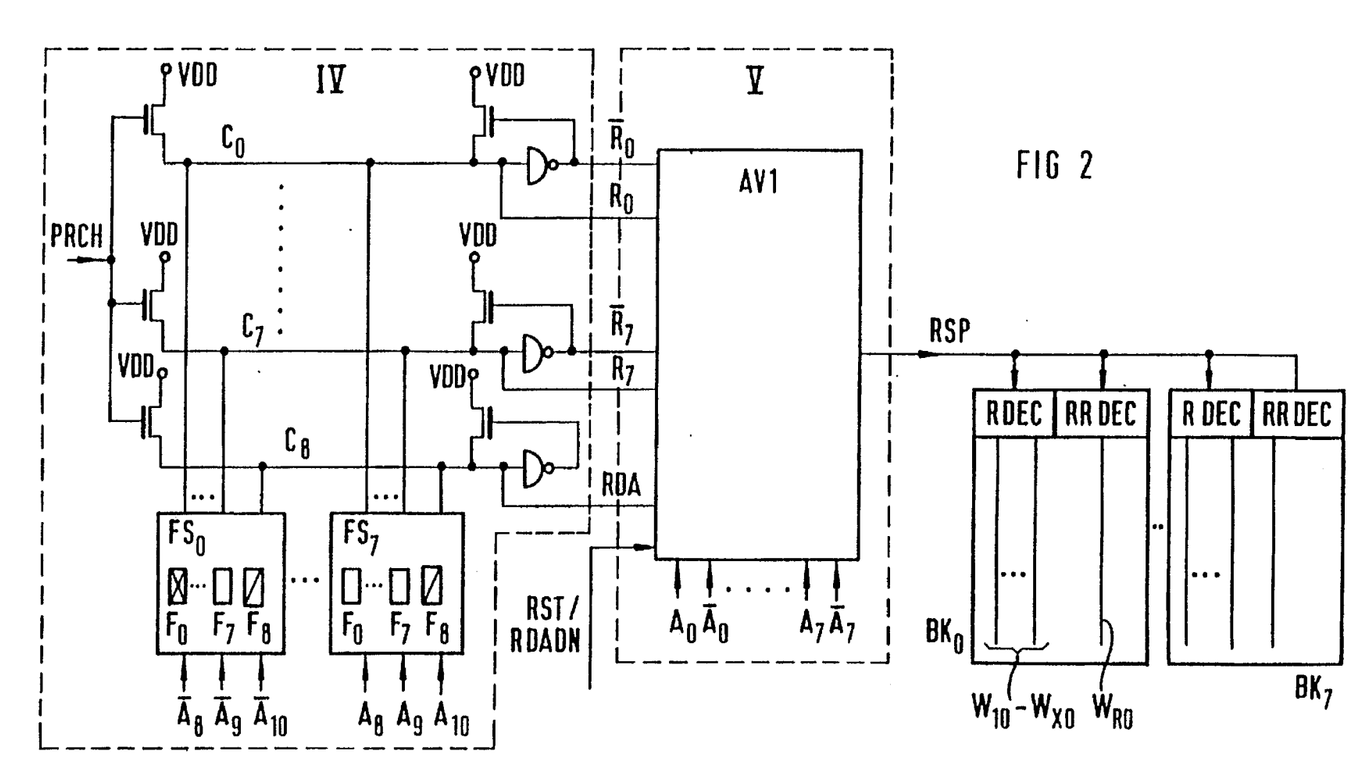
FIG. 2 is a schematic and block circuit diagram of a row-redundant circuit configuration.
Figure 4:
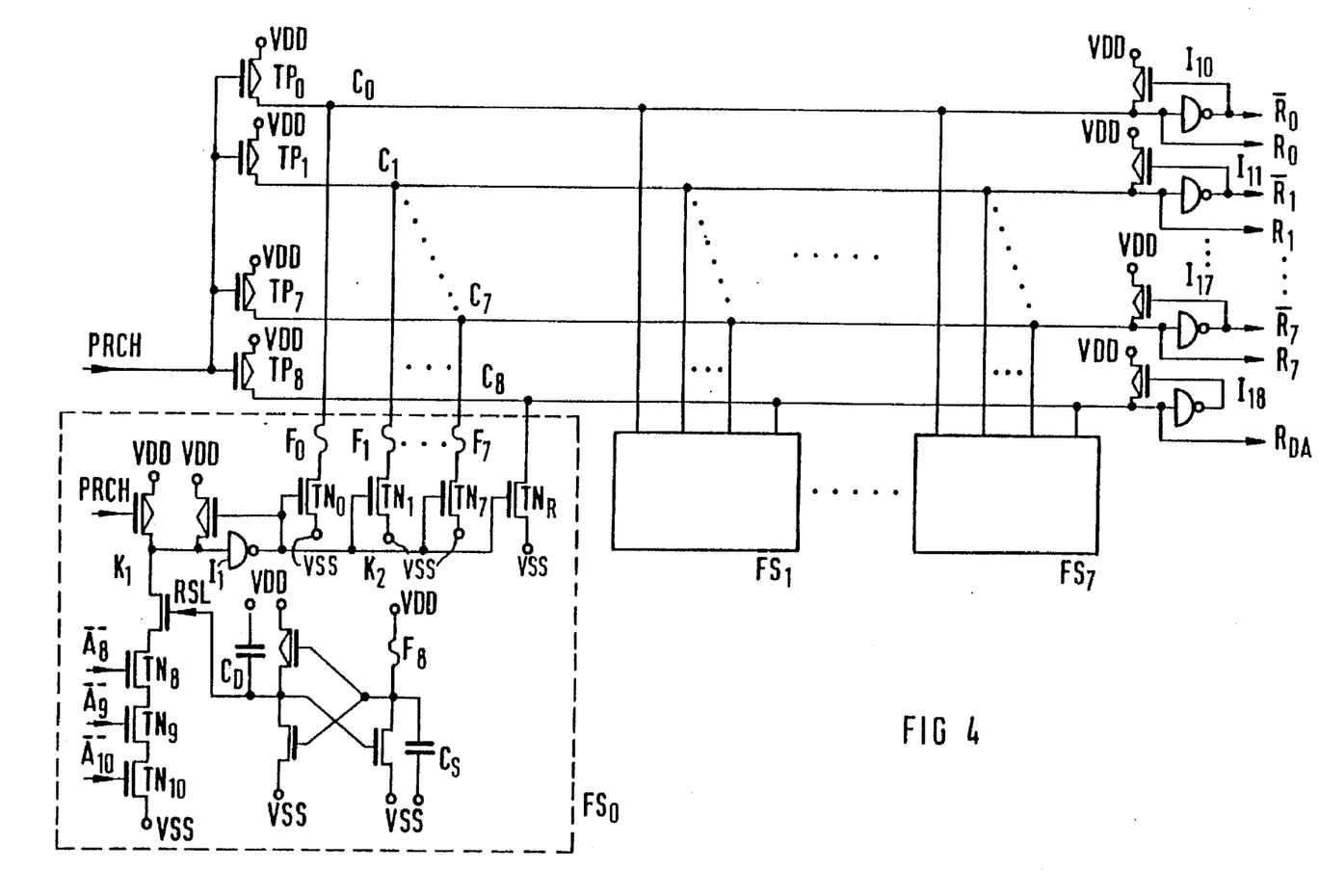
FIG. 4 is a schematic and block circuit diagram of an embodiment of the address circuits in accordance with the present invention.
Figure 5A:
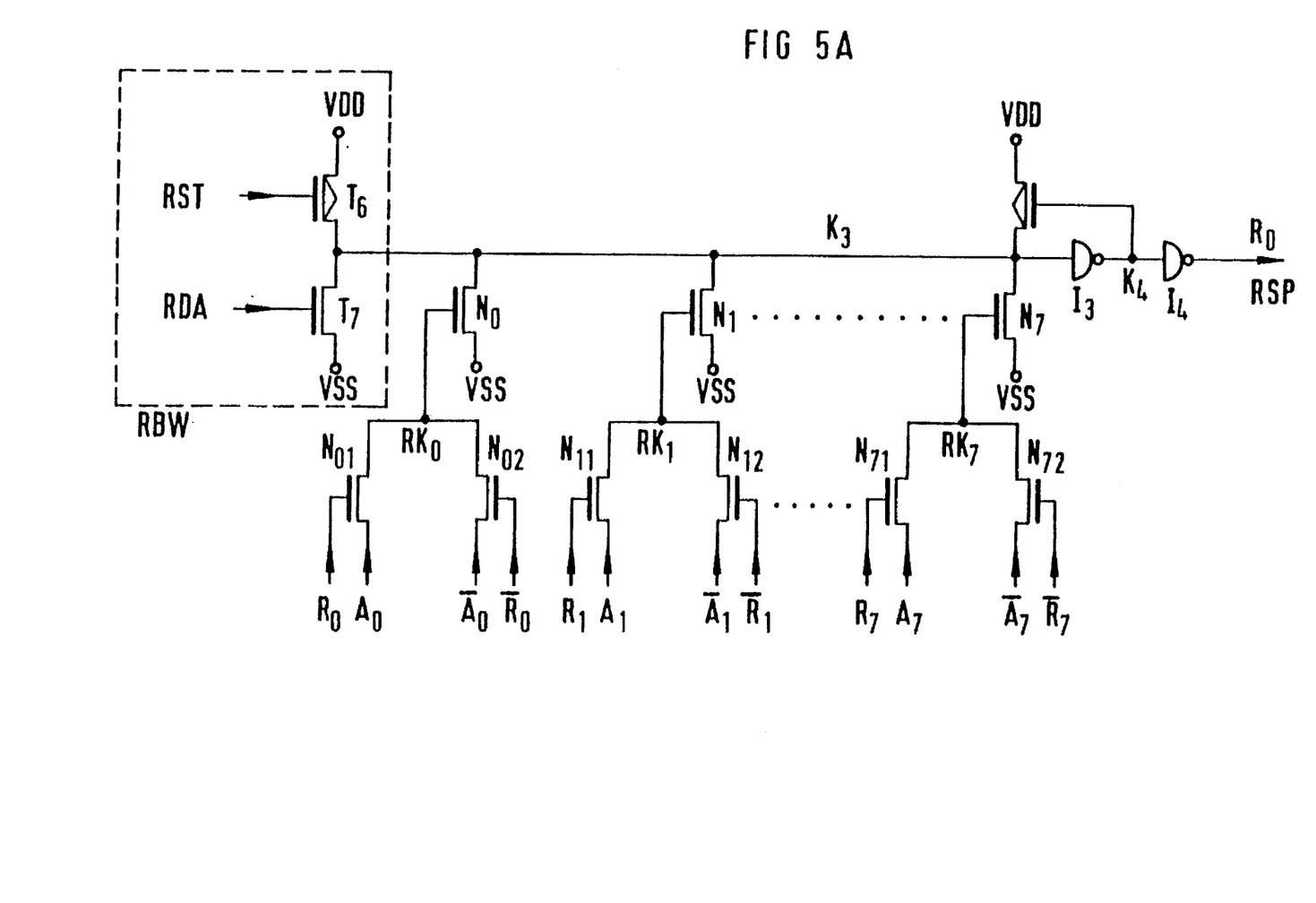

FIG. 2 shows a block circuit diagram of an embodiment of a redundant circuit configuration with row redundance according to the invention. Regions IV and V outlined in dashed lines are shown in greater detail in FIGS. 4 and 5, respectively.

Figure 3:
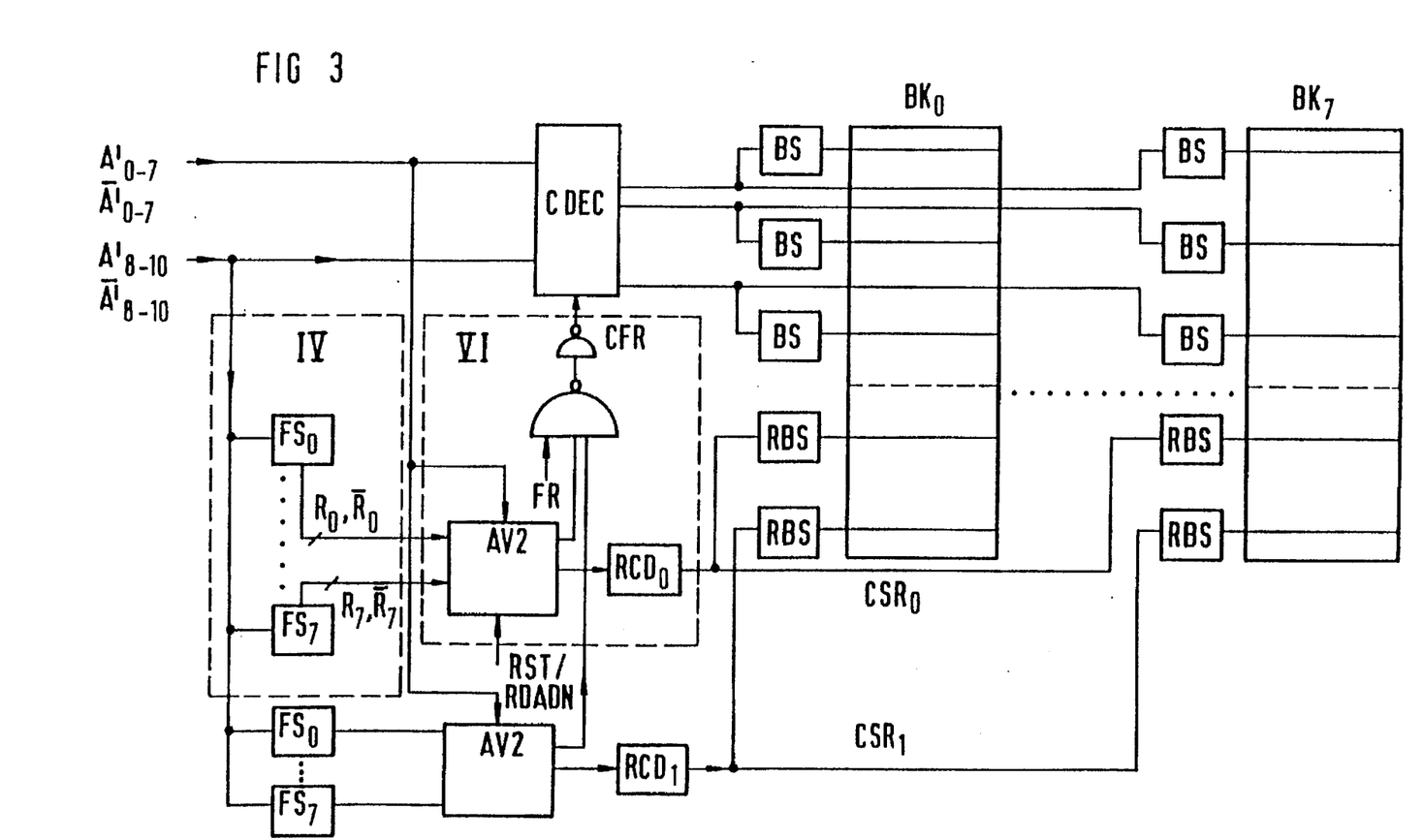
FIG. 3 is a schematic and block circuit diagram of a column-redundant circuit configuration.

FIG. 3 shows a block circuit diagram of an embodiment with column redundance.

In the examples that follow, the circuits are connected to a first reference potential VSS and a second reference potential VDD, which by way of example may be ground and a supply voltage, respectively.

Addresses $R_{0-7}$, $\overline{R}_{0-7}$ of a column or a row to be replaced are programmed in the circuit of FIG. 2, by way of example, through the use of a local coding bus $C_{0-7}$ and a number of address circuits $FS_0$–$FS_7$ that matches a number a of independent memory blocks $BK_0$–$BK_7$. FIG. 4 shows the address circuit $FS_0$ in detail. As an example, the choice in this case is a =8 memory blocks $BK_0$–$BK_7$. The internal block address, that is the address of one column or row within one memory block BK, is eight bits wide in this case. It is coded by the separable connections $F_0$–$F_7$, which are in this case connected between a first field effect transistor $TN_0$ ... 7 and a first node point of the coding bus. An additional fuse $F_8$ is cut if the redundance in the applicable memory block BK is used. Due to this additional fuse $F_8$, only eight fuses $F_0$–$F_7$ rather than the usual 16 fuses are needed for addressing.

In general, the memory has a memory blocks, and $A=2^M$. Each of the memory blocks $BK_0 \ldots 7$ has Y' columns and Y rows, wherein $Y=2^N$ and $Y'=2^{N'}$. In this case, N fuses (N equals the bit width of the internal block address) are needed for the internal block address for the rows. The memory blocks themselves are addressable through the use of 2·M address lines. A row address is designated below with reference symbol A, and a column address is designated as A'. Reference symbols $\overline{A}$ and $\overline{A}'$ designate the respective row and column addresses which are complementary to them.

The circuit shown in FIG. 2 is needed once per redundant line in each memory block BK, in contrast to the circuit shown in FIG. 1, where one circuit per redundant line is needed, or in other words in this case eight circuits. If two redundant lines are used in each memory block BK, then two circuits are used.

If the separable connection $F_8$ (see FIG. 4) is not interrupted, a readiness signal RSL is at the first reference potential VSS (ground). Two capacitors $C_S$ and $C_D$ of the address circuit $FS_0$ in FIG. 4 serves the purpose of securely setting the readiness signal RSL to the second reference potential VDD if the separable connection $F_8$ is cut.

In an address comparator circuit AV1 of FIG. 2, the applied internal block address $A_{0-7}$ is compared with the address $R_{0-7}$ to be replaced. In FIG. 5A, one embodiment of the circuit of the address comparator AV1 is shown.

Unlike the circuit shown in FIG. 1, where the address comparison takes place at each redundant circuit CF, according to the invention the comparison is carried out through the use of a single address comparator AV1. However, the address comparison is effected only whenever, in the addressed block, its associated address circuit $FS_0$–$FS_7$ is programmed, so that an activation signal RDA assumes a lower level, for instance, or in other words when the applied address meets a memory block BK, its address circuit (which is also referred to as a fuse box) $FS_0$–$FS_7$ is programmed. As a result, there is less strain on the internal block address lines $A_{0-7}$, $\overline{A_{0-7}}$, and the current consumption of the entire memory circuit is reduced.

Figure 5B:
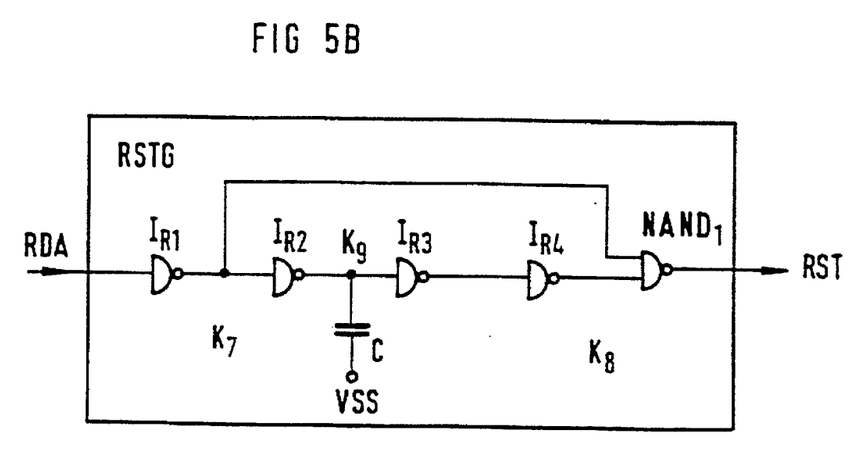
Figure 5C:
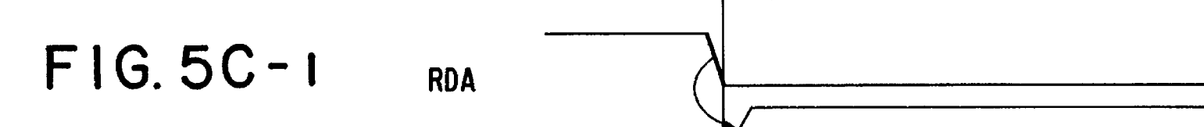
Figures 5C, 5C, 5C:
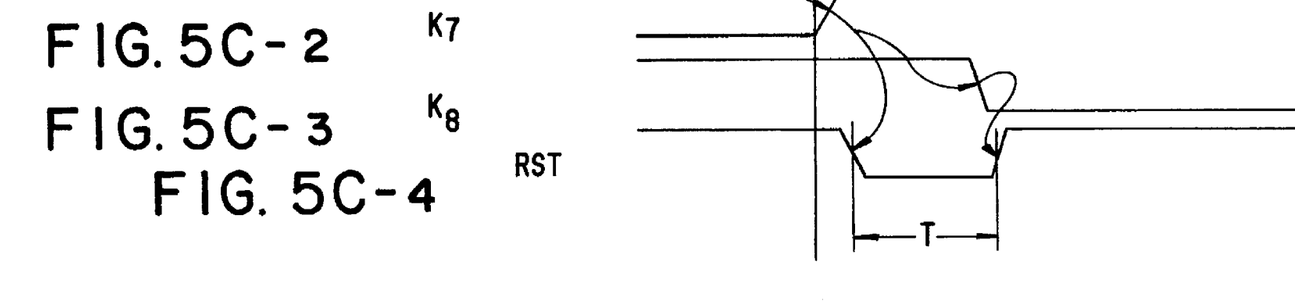
Figure 5D:
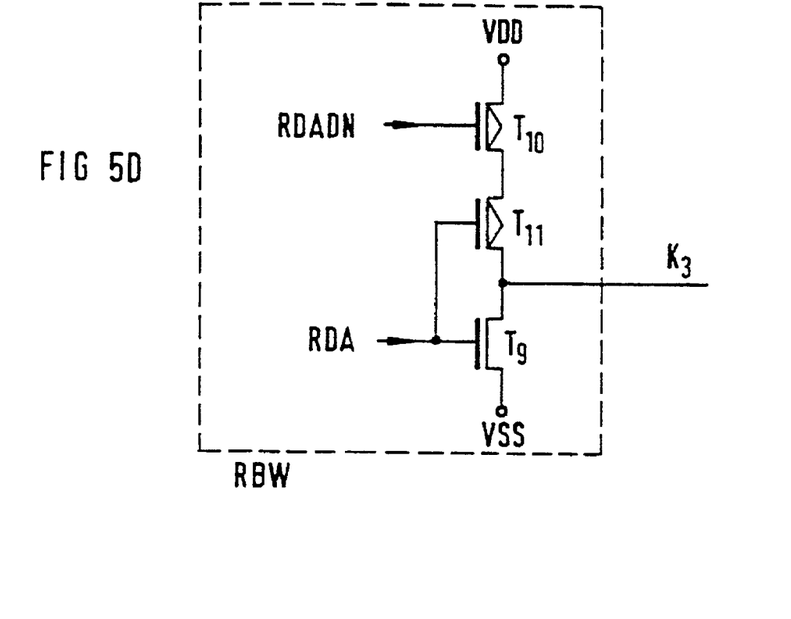

In an activation stage RBW, the address comparator AV1 in FIG. 5A uses a third control signal RST in the form of a pulsed signal, which can be generated from an activation signal RDA by a circuit shown in FIG. 5B. In FIG. 5D, a circuit variant of the activation stage RBW is shown, which uses a delayed force control signal RDADN instead of the pulsed signal RST. This circuit is somewhat faster than the circuit shown in FIG. 5A. The current consumption is reduced further through the use of this kind of pulsed signal RST or a delayed signal RDADN.

In the activation stage RBW, the address comparator AV1 in FIG. 5A uses the third control signal RST in the form of a pulsed signal, which can be generated from the activation signal by the circuit shown in FIG. 5B. The activation stage RBW in FIG. 5A includes a series circuit of a sixth and a seventh FET T6, T7. The FET T6 is a p-channel FET, and the FET T7 is an n-channel FET. The signals RDA and RST are respectively connected to control inputs of the seventh FET T7 and the sixth FET T6.

The third control signal RST can be generated from a circuit RSTG shown in FIG. 5B. The circuit RSTG includes a series circuit of first through fourth successive inverter stages $I_{R1}$ to $I_{R4}$. An input of the series circuit is supplied with the activation signal RDA, and an output K8 of the series circuit is connected to a NAND gate $NAND_1$. A node point $K_7$ between the first and second inverter stages $I_{R1}$, $I_{R2}$ is also connected to the NAND gate $NAND_1$. A capacitor C is connected between the first reference potential (ground) and a node point between the second and third inverter stages. The third control signal RST is the output signal of the NAND gate $NAND_1$. FIG. 5C shows a timing diagram of the circuit RSTG. The third control signal RST is a pulse that changes to logical "0" for a time interval T if the activation signal RDA changes to logical "0", and otherwise the third control signal RST is at the level of logical "1".

In FIG. 5D, a variant of the activation stage RBW is shown that uses the fourth control signal RDADN instead of the third control signal RST. Instead of a pulse like the control signal RST, the control signal RDADN is a signal, which after a time interval T' after which. RDA has dropped to logical "0", triggers the level of logical "1". The activation stage RBW in FIG. 5D contains a series circuit of a ninth, a tenth and an eleventh field effect transistor $T_9$–$T_{11}$. The transistor $T_9$ is of the n-channel type, and the transistors $T_{10}$ and $T_{11}$ are of the p-channel type. The activation signal RDA is connected to control inputs of the ninth and eleventh FETs $T_9$, $T_{11}$, and the fourth control signal RDADN is connected to a control input of the tenth FET $T_{10}$.

Figure 5E:
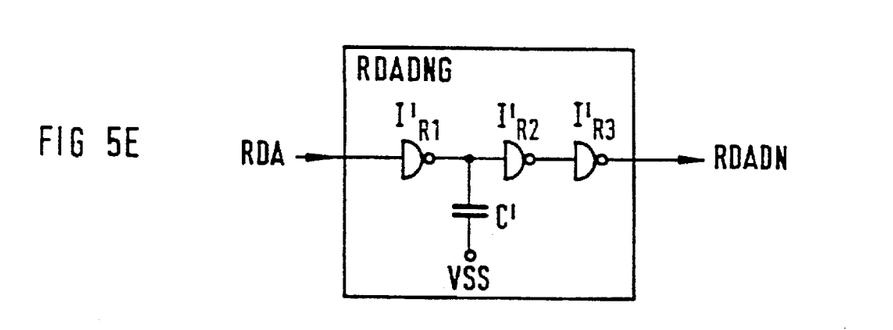
Figure 5F:
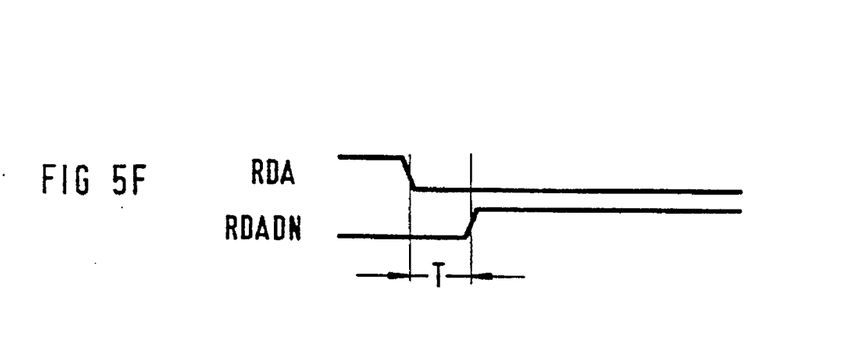

The third control signal can be generated, by way of example, with a circuit RDADNG shown in FIG. 5E, which includes a series circuit of first through third successive inverter stages $I_{R1}$–$I_{R3}$. An input of the series circuit is supplied with the activation signal RDA, and the fourth control signal RDADN occurs at an output of the series circuit. A capacitor C' is connected between the first supply potential (ground) and a node point between the first and second inverter stages $I_{R1}$, $I_{R2}$ FIG. 5F shows a timing diagram of the circuit RDADNG.

As FIG. 2 shows, an output signal RSP of the address comparator AV1, at the onset of redundance, triggers a redundant row decoder RR DEC and simultaneously locks a normal row decoder R DEC in each memory block $BK_0$–$BK_7$. A redundant row $W_{Rk}$ is thus addressed, instead of a row $W_{ik}$ to be replaced in the memory block $BK_k$.

FIG. 3 shows a block circuit diagram of an embodiment of the redundant circuit configuration according to the invention in the case of column redundance. Regions IV and VI outlined in dashed lines are shown in greater detail in FIGS. 4 and 6, respectively.

The function of an address comparator AV2 is the same as that of the address comparator AV1 shown in FIGS. 2 and 5A. In comparison to the row redundance, access is made in this case to a fourth control signal ATDN. As is described in further detail below, the fourth control signal ATDN serves the function of preventing transverse currents through the address comparator AV2. FIG. 3 also shows how two rows of address circuits $FS_0$–$FS_7$ and two address comparators AV2 are connected with one another, if in each block two redundant column decoders $RCD_0$ and $RCD_1$ with selection lines $CSR_0$ and $CSR_1$ are used. The redundant column decoders $RCD_0$ and $RCD_1$ each control one redundant bit switch RBS per memory block $BK_{0-7}$. Through the use of the signal CFR, if a redundant column is selected, the normal column decoder CDEC is locked, so that in this case the normal bit switch BS is not triggered.

Figure 6:
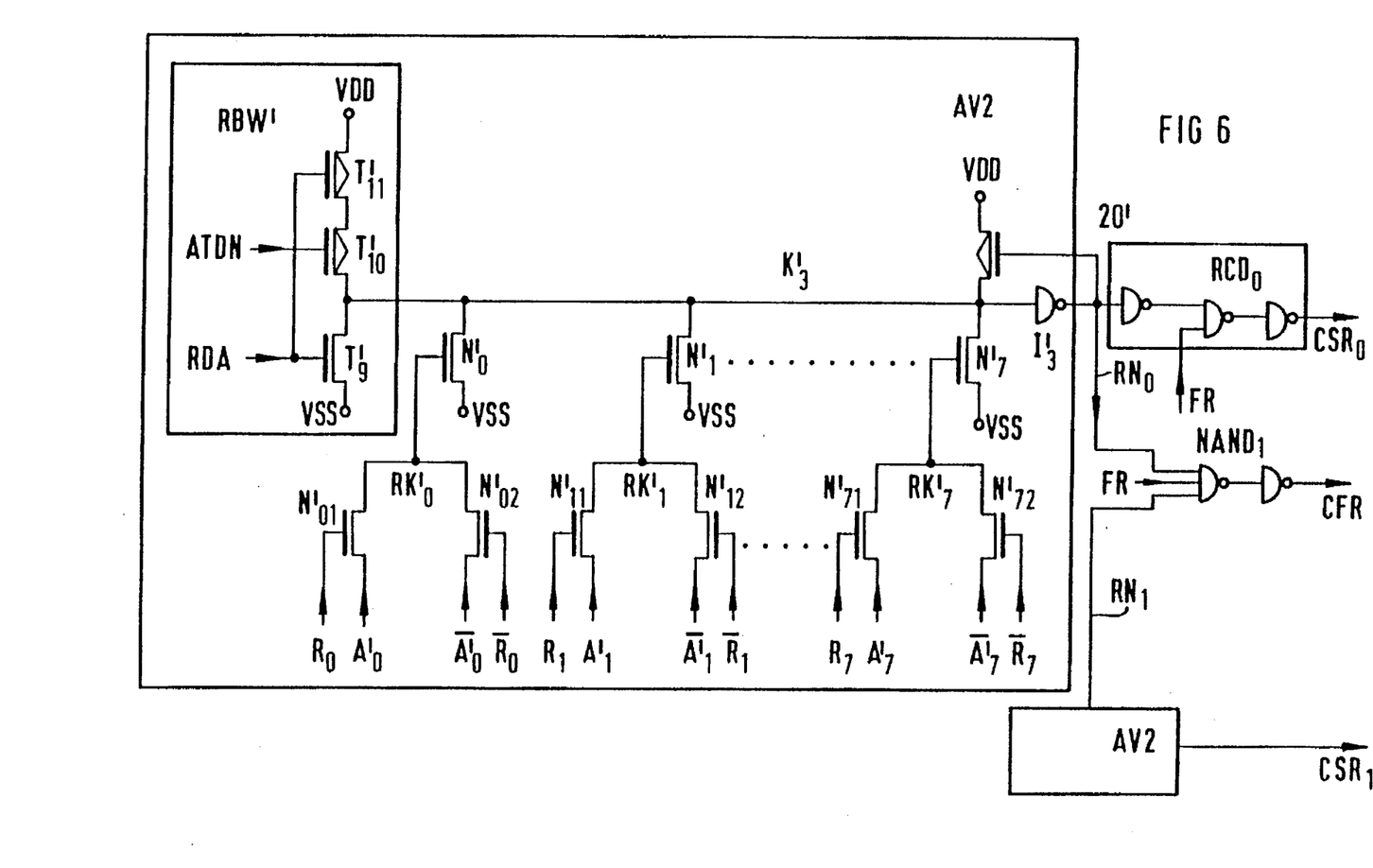
FIG. 6 is a schematic and block circuit diagram of an embodiment of the address comparator with column redundance in accordance with the present invention.

In the address comparator circuits AV2 shown in both FIGS. 5A and 6, the redundance enable signal $CSR_0$ is not activated, or in other words a third node point $K'_3$ is not logical "1", unless all nodes $RK'_0$–$RK'_7$ are logical "0". If at least one of these nodes $RK'_{0-RK'7}$ is logical "1" then, through a turned-on n-channel transistor $N'_0$–$N'_7$, the node $K'_3$ remains at such a low potential that the inverter $I_3'$ following it on the output side stays at the level of logical "1".

Figure 7A:
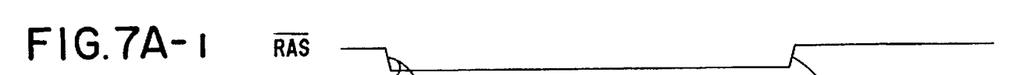
Figure 7A:
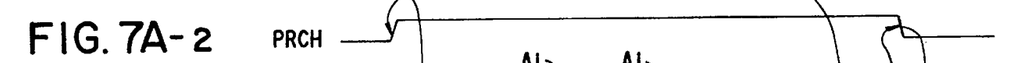
Figure 7A:
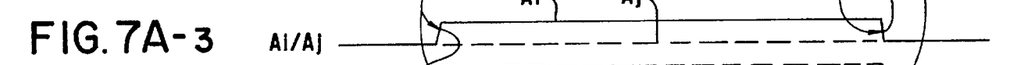
Figure 7A:
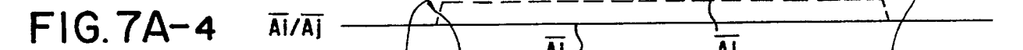
Figure 7A:
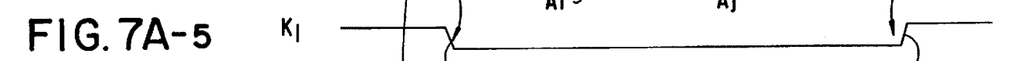
Figure 7A:
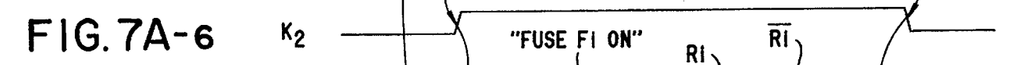
Figure 7A:
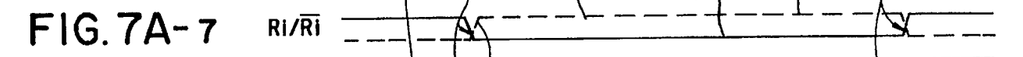
Figure 7A:
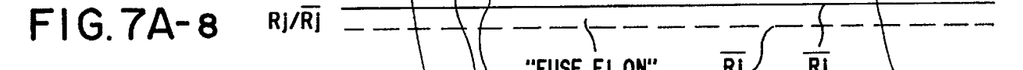
Figure 7A:
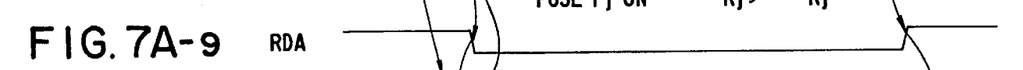
Figure 7A:
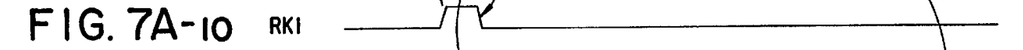
Figure 7A:
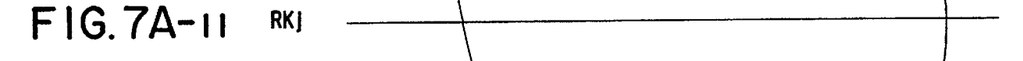
Figure 7A:
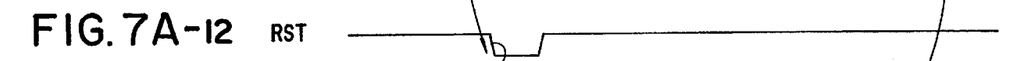
Figure 7A:
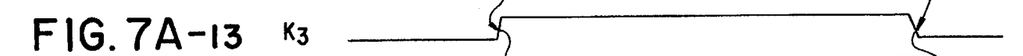
Figure 7A:
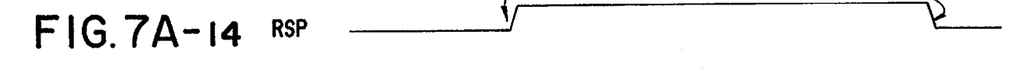
Figure 7B:
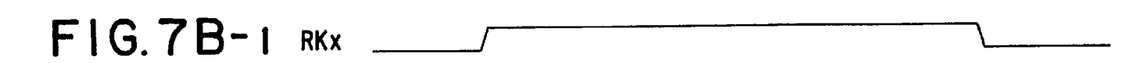
Figure 7B:
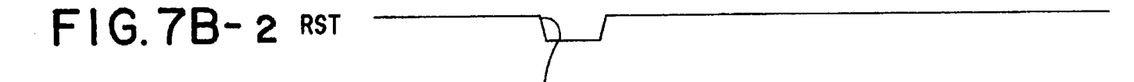
Figure 7B:
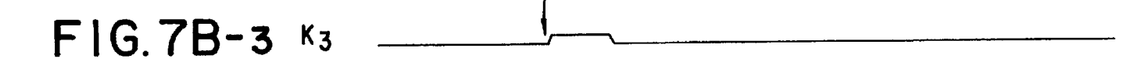
Figure 7B:
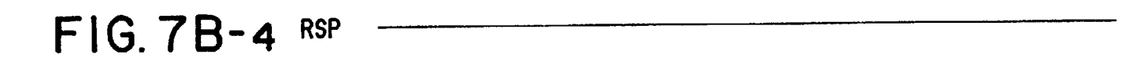

The function of the circuit of FIGS. 2, 4 and 5A will be described below in terms of the timing diagram of FIGS. 7A and 7B, in which only the memory signals that are necessary for this purpose are shown. FIG. 7A shows a cycle with the use of row redundance, while FIG. 7B shows the normal case, that is without the use of the redundance.

In the resting phase ($\overline{RAS}$=logical "1"), the addresses $A_{0-7}$ $\overline{A_{0-7}}$ and a second control signal or charge signal PRCH are in the state of logical "0". In this state, n-channel third field effect transistors $N_{0-7}$ are all blocked, and p-channel second field effect transistors $TP_{0-8}$ are conducting. A node $K_1$ is accordingly at logical "1", and a node $K_2$, which furnishes a first control signal to the first transistors $TN_{0...7}$ and $TN_R$, is logical "0". First address outputs $R_{0-7}$ and a first output RDA of a local coding bus $C_0$–$C_8$ are all at logical "1", while outputs $\overline{R_{0-7}}$ that are complementary to the first address outputs are at logical "0". As a result, the third node point $K_3$ is at logical "0", and the enable signal RSP is logical "0".

A writing or reading cycle is initiated by the trailing edge of the signal $\overline{RAS}$. After the trailing edge of the signal $\overline{RAS}$, the second control signal PRCH becomes logical "1". The state of logical "1" of the node $K_1$ is preserved by the restraint of the connected inverters $I_1$. Shortly thereafter, a certain combination of output lines $A_{0-10}$ and $\overline{A_{0-10}}$ becomes active at logical "1", where $A_{0-7}$ and $\overline{A_{0-7}}$ represent the internal block address, and $A_{8-10}$ and $\overline{A_{8-10}}$ represent the block address. For example if $A_8$, $A_9$ and $A_{10}$ are all logical "1" then the memory block $BK_0$ is addressed. The three n-channel transistors $TN_8$–$TN_{10}$ of the address circuit FS0 are therefore conducting. Fourth node points $RK_i$ are charged to logical "1" where $A_i$=logical "1" and otherwise, $RK_j$ are at logical "0".

If this address circuit FS0 is coded, then the additional fuse $FS_8$ is cut. As a result, the signal RSL is at logical "1", the node $K_1$ therefore becomes logical "0", and the node $K_2$ becomes logical "1". The embodiment of the address circuit shown in FIG. 4 is connected in such a way that a cut fuse $F_j$, where j=0–7, is a logical "1", and an intact fuse $F_i$ means logical "0". The address $R_{0-7}$, $\overline{R_{0-7}}$ of the row to be replaced is generated through the use of the coding bus $C_0$–$C_7$. Simultaneously, the activation signal RDA, which is logical "0", is generated at a first input $C_8$ of the address circuit. If all of the $R_i$ and $A_i$, on one hand, and $\overline{R_i}$ and $\overline{A_i}$ (where i=0 ... 7), on the other hand, are identical, then all of the $RK_i$ become logical "0". All of the third (n-channel) field effect transistors $N_0$–$N_7$ therefore block.

The trailing edge of the signal RDA generates the pulse RST, which for a time interval T becomes logical "0". Since all of the third n-channel transistors $N_{0-7}$ are blocking, the third node point $K_3$ rises to logical "1". Through the use of the hold stage $I_3$, which in this case is in the form of a restraint-connected inverter $I_3$, the node $K_3$ stays (at logical "1") even after the pulse RST has returned to logical "1". As a result, the enable signal RSP becomes logical "1", for triggering the redundant decoders.

In the normal case, that is if the addresses $A_{0-7}$ and $R_{0-7}$ do not match, then at least one $A_n$ is not equal to $R_n$. As a result, at least one fourth node point $RK_n$ remains at logical "1". If the pulse signal RST becomes logical "0", then although the potential of the third node point $K_3$ rises, nevertheless as a result of the conducting n-channel transistor $N_n$ the potential does not rise sufficiently to switch over the hold-back-connected inverter $I_3$. The node point $K_3$ therefore remains at logical "0" after the pulse RST, and the enable signal RSP remains at logical "0".

Figure 8A:
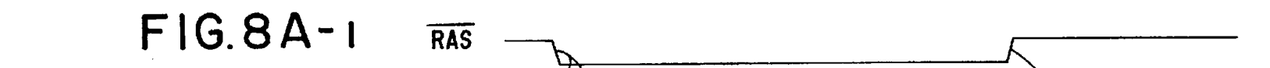
Figure 8A:
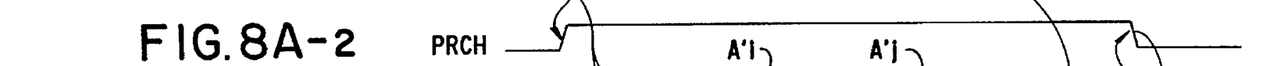
Figure 8A:
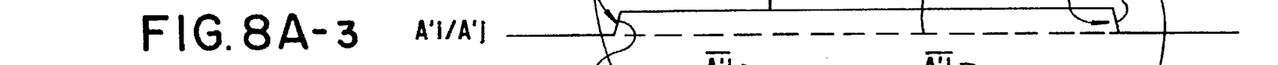
Figure 8A:
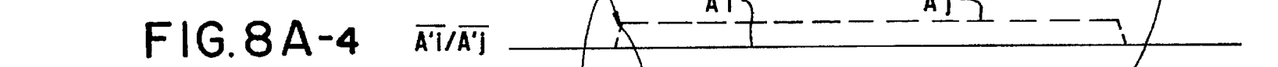
Figure 8A:
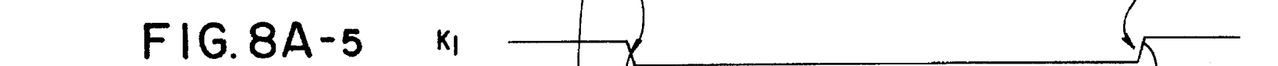
Figure 8A:
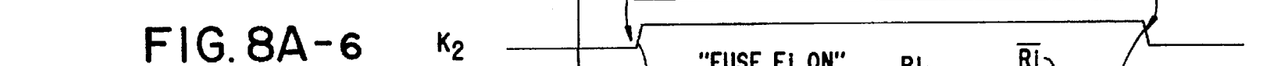
Figure 8A:
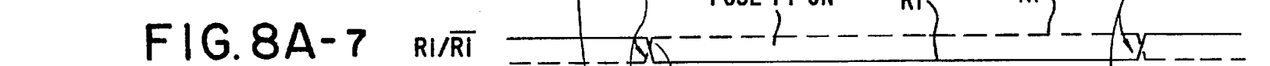
Figure 8A:
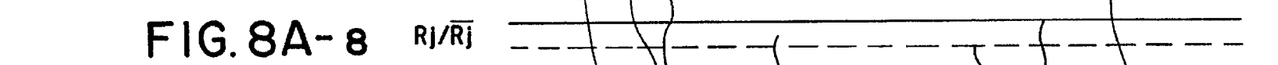
Figure 8A:
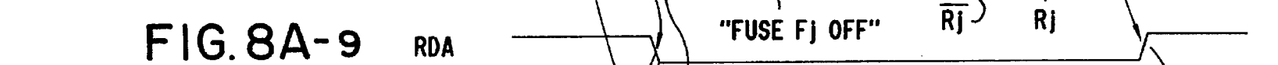
Figure 8A:
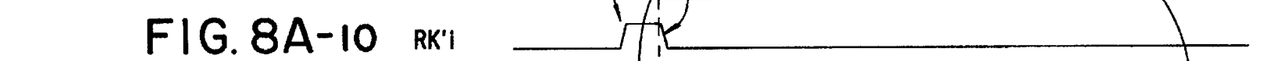
Figure 8A:
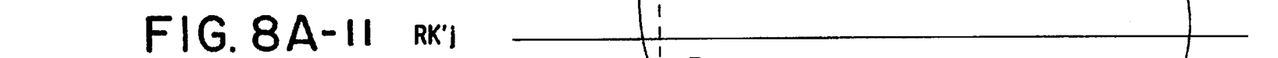
Figure 8A:
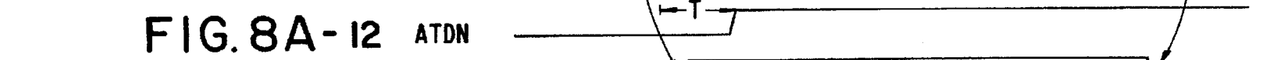
Figure 8A:
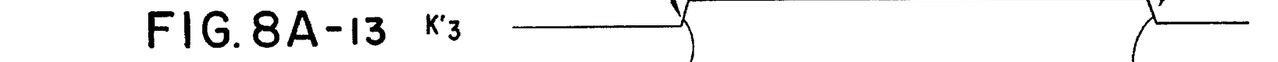
Figure 8A:
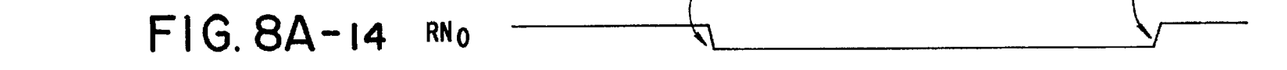
Figure 8A:
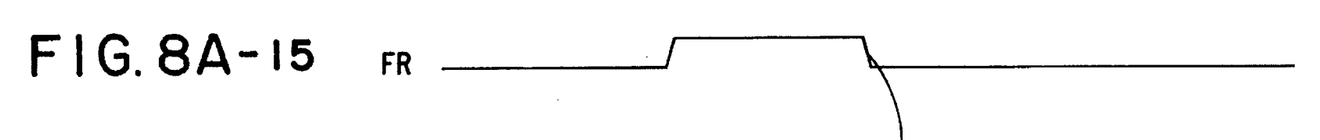
Figure 8A:
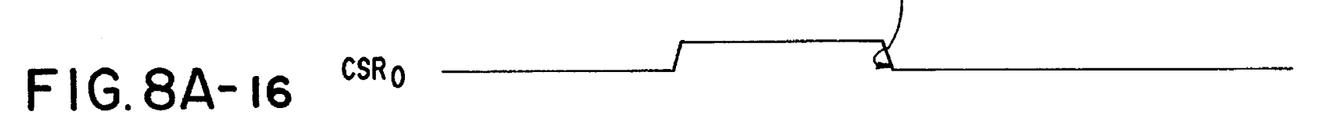
Figure 8A:
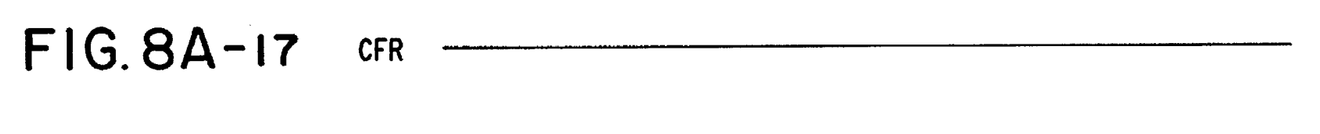
Figure 8B:
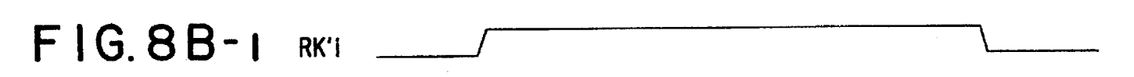
Figure 8B:
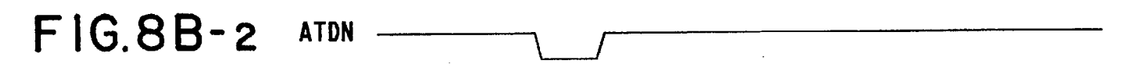
Figure 8B:
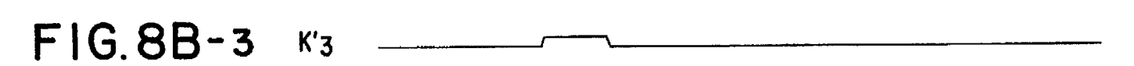
Figure 8B:
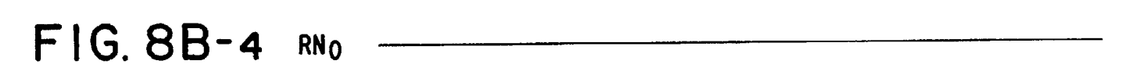
Figure 8B:
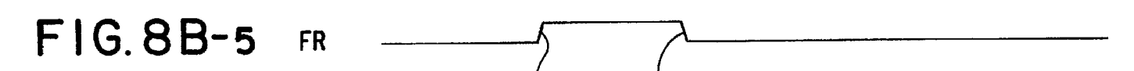
Figure 8B:
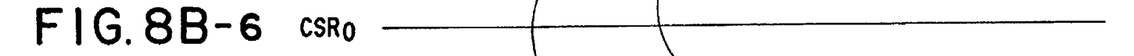
Figure 8B:
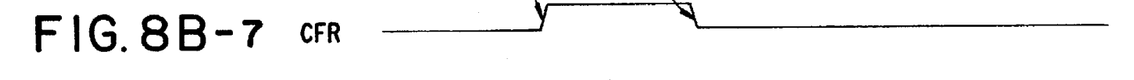

The function of the redundant circuit configuration shown in FIGS. 3, 4 and 6 for column redundance will not be described in terms of the timing diagram of FIGS. 8A and 8B. Instead, only the distinctions from the timing diagram shown in FIG. 3 will be described. In comparison with FIG. 4, in this case the third control signal RST is replaced by the fourth control signal ATDN, which like the signal RDADN can be generated from the activation signal RDA by a circuit in accordance with FIG. 5E. A data enable signal FR that is already present in other subcircuits of the memory is also used. Reference symbol $CSR_0$ indicates an enable signal for a redundant column decoder RBS, and reference symbol CFR indicates a signal that in the state of logical "1" blocks the normal column decoder CDEC. The signal CFR is generated by an AND gate from signals $RN_0$, $RN_1$. In other words, the signal CFR becomes logical "1" with one of the redundant column decoders turned on. FIG. 8A, as in FIGS. 7A and 7B shows a timing diagram for redundance, and FIG. 8B shows the "normal case".

In the resting phase ($\overline{RAS}$=logical "1"), the addresses $A'_{0-7}$ and $\overline{A'_{0-7}}$ and the second control signal PRCH are in the state of logical "0". In this state, all of the n-channel first field effect transistors $N_{0-7}$ are blocked, and the p-channel second field effect transistors $TP_{0-8}$ are conducting. Consequently, the node $K_1$ is logical "1", and the node $K_2$, which furnishes a first control signal to the first transistor $TN_{0...7}$ and $TN_R$, is logical "0". The first address output $R_0$ ...7 and the first output RDA of the local coding bus $C_0$–$C_8$ are logical "1", while the address outputs $\overline{R_{0...7}}$, that are complementary to the first address output, are logical "0". As a result, the third node point $K'_3$ is logical "1", and the enable signal $RN_0$ is logical "1". The redundant bit recorder $RCD_0$ is therefore locked. The control signal $CSR_0$ therefore remains at logical "0", and the redundant bit circuits RBS therefore remain locked. The normal column decoder DCEC is also locked by the signal CFR=logical "0".

A writing or reading signal is initiated by the trailing edge of the signal $\overline{RAS}$. After the trailing edge of the signal $\overline{RAS}$, the second control signal PRCH becomes logical "1". The logical "1" state of the node $K_1$ is preserved by the restraint-connected inverter $I_1$.

Shortly thereafter, a certain combination of output lines $A'_{0-10}$ and $\overline{A'_{0-10}}$ becomes active at logical "1", where $A'_{0-7}$ and $\overline{A'_{0-7}}$ represent the internal block address, and $A'_{8-10}$ and $\overline{A'_{8-10}}$ represent the block address. The fourth node points $RK'_i$ are charged to logical "1", where $A'_i$=logical "1" and otherwise, the fourth node points $RK'_j$ are at logical "0".

If this address circuit is coded, then an additional fuse $FS_8$ is cut. As a result, the signal RSL is at logical "1", the node $K_1$ therefore becomes logical "0", and the node $K_2$ becomes logical "1". Through the use of the coding bus $C_0$–$C_8$, the address $\overline{R_0}_{...7}, R_{0...7}$ of the row to be replaced is generated. Simultaneously, the signal RDA becomes logical "0". If all of the $R_i$ and $A'_i$, on one hand, and $\overline{R_i}$ (where i =0 ... 7) on the other hand, are identical, then all of the $RK'_i$ become logical "0". All of the n-channel transistors $N'_0$–$N'_7$ therefore block.

The trailing edge of the signal RDA generates the fourth control signal ATDN, which for a time interval T becomes logical "1". Since all of the third n-channel transistors $N'_0$ .. 7 are blocking, the node $K'_3$ in this time interval T' rises to logical "1". Through the use of the restraint circuit of the inverter $\Gamma_3$, in this time interval the node $K'_3$ remains at the level of logical "1" even if the fourth signal ATDN has risen to the value of logical "0". As a result, the redundance enable signal $RN_0$ becomes logical "0". If the enable signal FR becomes logical "1", the redundant signal $RCD_0$ turns on, and the control signal $RSR_0$ of the redundant bit switch RBS becomes logical "1". At the same time, the signal CFR remains logical "0", and the normal column decoder CDEC remains locked.

In the normal case, that is if the addresses $A'_{0-7}$ and $R_{0-7}$ do not match, then at least one $A'_i$ is not equal to $R_i$. As a result, at least one node point $RK'_n$ remains at logical "1". If the signal RDA becomes logical "0", and the fourth control signal ATDN becomes logical "1", then although the potential of the third node point $K'_3$ rises, nevertheless as a result of the conducting n-channel transistor $N'_i$ the potential does not rise sufficiently to switch over the restraint-connected inverter $\Gamma_3$. The node $K'_3$ therefore remains at logical "0" after the signal ATDN, and the signal $RN_0$ remains at logical "1". The redundant bit decoder $RCD_0$ stays locked. If the enable signal FR becomes logical "1", then the signal CFR rises to logical "1", and the normal column decoder CDEC is activated.

Although in the examples only one row or column is replaceable through the use of the redundant circuit configuration according to the invention, it is also readily possible for a group of 2, 4 or 8 rows or columns, for example, to be replaceable simultaneously. In that case, the internal block addresses stored in memory in the address decoders $FS_0$–$FS_7$ are 1, 2 or 3 bits shorter. The above-described exemplary measurement examples should therefore be understood to mean that an arbitrary group of rows or columns is addressable by the internal block address, even though in the exemplary embodiments only one row or one column at a time is addressed.

The redundant circuit configuration according to the invention can also be used independently of the memory architecture and of the subdivision into memory blocks. Instead of assigning each address circuit to one block address as in the exemplary embodiments above, it is possible in general to assign each address circuit to a first partial address of the complete address of a group of memory cells. The second partial address, that is the remainder of the complete address, is encoded in the address circuits, for example through the use of separable connections such as laser fuses. Thus, for instance, each address circuit can be assigned to two memory blocks at a time, if in a memory having eight memory blocks and four address circuits, for instance, only two address lines $A_8$, $A_9$ of the block address $A_8$, $A_9$, $A_{10}$ are used for selecting the address circuit. The third block address line, for instance $A_{10}$, can additionally be used in the address decoders $FS_0$–$FS_7$, and the address comparison AV1, AV2 thus gains one additional address line. Thus through the use of a single active address circuit, such as $FS_2$, groups of memory cells can be replaced selectively in two different memory blocks. Conversely, a plurality of address circuits can also be assigned to one or more memory blocks jointly, to create a kind of block-free redundance in this way. When an address is applied, only one address circuit is ever activated. A bit width n1 of the first partial address of the number M of address circuits must thus be chosen in such a way that $M \geq 2^{n1}$.

We claim:

1. In a redundant circuit configuration for an integrated semiconductor memory with normal and redundant memory cells, in which addresses of arbitrary groups of memory cells of the memory are formed from a first partial address and a second partial address, the improvement comprising:

M fixedly programmable address circuits, where $M \geq 1$, each fixedly programmable address circuit being assigned to one of the first partial addresses, and each fixedly programmable address circuit in an activated state having the second partial address of a group of normal memory cells to be replaced and having a first output at which an activation signal is applied in the activated state of said address circuit if the first partial address applied to the circuit configuration matches the first partial address assigned to said address circuit; and one address comparator being common to all of said address circuits and having a first output, said comparator comparing the second partial address stored in memory in one of said address circuits with the applied second partial address, at the applied activation signal of said one address circuit, said comparator supplying an enable signal at the first output of said address comparator if the two partial addresses match, and redundance decoders being triggered by the enable signal.

2. The redundant circuit configuration according to claim 1, wherein each of said address circuits includes N+1 separable connections for programming each of said address circuits, where N is a bit width of the second partial address.

3. The redundant circuit configuration according to claim 1, including a local coding bus connecting said address comparator with all of said address circuits, said local coding bus providing the second partial addresses being stored in memory in said address circuits and providing the activation signal, to said address comparator.

4. The redundant circuit configuration according to claim 2, including:

a local coding bus being formed by first node points and said first output of said fixedly programmable address circuit, each of said first node points forming a first address output;

each of said address circuits including N series circuits each having one openable fuse element and one first field effect transistor, said first field effect transistors having control terminals receiving a first control signal, said series circuits each being connected between a first supply potential and a respective one of said first node points;

said fuse elements including fuse elements corresponding to one another in said address circuits and being connected to the same node points;

first inverters each having an input and each having an output forming an address output being complementary to said respective first address output; and second field effect transistors each connecting a respective one of said first node points to a second supply potential and to said input of a respective one of said first inverters, said second field effect transistors having control terminals receiving a second control signal.

5. The redundant circuit configuration according to claim 4, including:

a third node point;

N fourth node points;

said address comparator having N third field effect transistors, where N is a bit width of the second partial address, said third field effect transistors having load paths connected between said third node point and a first supply potential, said third field effect transistors having control inputs each being connected to a respective one of said N fourth node points;

fourth and fifth field effect transistors each being associated with a respective one of said fourth node points;

each of said fourth field effect transistors having a load path being connected between said associated fourth node point and an associated address line of the applied address;

each of said fifth field effect transistors having a load path being connected between said associated fourth node point and an address line being complementary to the respective associated address line;

said fourth field effect transistors having control terminals each being connected to a respective address line of the second partial address stored in memory in said address circuits;

said fifth field effect transistors having control terminals each being connected to an address line being complementary to the respective address line of the second partial address stored in memory in said address circuits; and said address comparator including a hold stage having an input terminal being connected to said third node point and having an output terminal at which the first enable signal can be picked up, and said address comparator including an activation stage supplying an output signal being imposed upon said third node point.

6. The redundant circuit configuration according to claim 5, wherein said activation stage includes a series circuit of sixth and seventh field effect transistors having load paths with a node point therebetween being part of said third node point, said series circuit is connected between the first and a second reference potential, said control terminal of said sixth field effect transistor receives a third control signal, and said control terminal of said seventh field effect transistor receives the activation signal of said address circuits.

7. The redundant circuit configuration according to claim 6, including a circuit for generating said third control signal, said circuit having a series circuit of first, second, third and fourth successive inverter stages with node points between said first and second inverter stages and between said second and third inverter stages, said circuit having an input receiving said activation signal of said address circuits, said circuit having an output, said circuit having a NAND gate with a first input connected to said output of said series circuit, a second input connected to said node point between said first and second inverter stages and an output at which said third control signal can be picked up, and said circuit having a capacitor connected between the first supply potential and said node point between said second and third inverter stages.

8. The redundant circuit configuration according to claim 5, wherein said activation stage has a ninth field effect transistor and a series circuit of tenth and eleventh field effect transistors, said ninth, tenth and eleventh field effect transistors have load paths and control terminals, said series circuit is connected between a second supply potential and said third node point, said load path of said ninth field effect transistor is connected between said third node point and the first supply potential, said ninth and eleventh field effect transistors are of mutually complementary conduction types, said control terminals of said ninth and eleventh field effect transistors receive said activation signal of said address circuits, and said control terminal of said tenth field effect transistor receives a fourth control signal.

9. The redundant circuit configuration according to claim 1, wherein the memory cells are disposed in M memory blocks, said memory blocks can be called up through a block address, and the memory cells within one of said memory blocks can be called up through an internal block address, where M≧1, the first partial address is the block address and the second partial address is the internal block address, and each of said fixedly programmable address circuits is assigned to one of said M memory blocks.

10. The redundant circuit configuration according to claim 1, wherein the semiconductor memory is a dynamic access semiconductor memory.

* * * * *